(12) United States Patent
Rizzo Piazza Roncoroni et al.

(10) Patent No.: US 8,960,001 B2
(45) Date of Patent: Feb. 24, 2015

(54) MICROELECTROMECHANICAL DEVICE HAVING AN OSCILLATING MASS AND METHOD FOR CONTROLLING A MICROELECTROMECHANICAL DEVICE HAVING AN OSCILLATING MASS

(71) Applicant: STMicroelectronics S.r.l., Agrate Brianza (IT)

(72) Inventors: Alessandra Maria Rizzo Piazza Roncoroni, Abbiategrasso (IT); Carlo Caminada, Pregnana Milanese (IT); Luciano Prandi, Bellinzago Novarese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/904,847

(22) Filed: May 29, 2013

(65) Prior Publication Data
US 2013/0249642 A1 Sep. 26, 2013

Related U.S. Application Data

(63) Continuation of application No. 12/975,189, filed on Dec. 21, 2010, now Pat. No. 8,474,317.

(30) Foreign Application Priority Data

Dec. 21, 2009 (IT) .............................. TO2009A1017
Feb. 15, 2010 (IT) .............................. TO2010A0106

(51) Int. Cl.
| | | |
|---|---|---|
| G01C 19/56 | (2012.01) | |
| H03B 5/30 | (2006.01) | |
| H03L 3/00 | (2006.01) | |

(52) U.S. Cl.
CPC ........ *H03B 5/30* (2013.01); *G01C 19/56* (2013.01); *H03L 3/00* (2013.01)
USPC ........................................................ 73/504.12

(58) Field of Classification Search
CPC ....... G01C 19/56; G01C 19/5776; H03L 3/00
USPC ........................................ 73/504.12; 331/154
See application file for complete search history.

(56) References Cited

U.S. PATENT DOCUMENTS

| 6,585,338 B2 | 7/2003 | Harris |
|---|---|---|
| 6,766,689 B2 | 7/2004 | Spinola Durante et al. |

(Continued)

FOREIGN PATENT DOCUMENTS

| CN | 101271125 A | 9/2008 |
|---|---|---|
| EP | 1253399 A1 | 10/2002 |

(Continued)

*Primary Examiner* — John Chapman, Jr.
(74) *Attorney, Agent, or Firm* — Seed IP Law Group PLLC

(57) ABSTRACT

A microelectromechanical device includes a body, a movable mass, elastically connected to the body and movable in accordance with a degree of freedom, and a driving device, coupled to the movable mass and configured to maintain the movable mass in oscillation at a steady working frequency in a normal operating mode. The microelectromechanical device moreover includes a start-up device, which is activatable in a start-up operating mode and is configured to compare a current oscillation frequency of a first signal correlated to oscillation of the movable mass with a reference frequency, and for deciding, on the basis of the comparison between the current oscillation frequency and the reference frequency, whether to supply to the movable mass a forcing signal packet so as to transfer energy to the movable mass.

21 Claims, 5 Drawing Sheets

(56) References Cited

U.S. PATENT DOCUMENTS

| | | |
|---|---|---|
| 6,911,928 B2 | 6/2005 | Orsier et al. |
| 7,305,880 B2 | 12/2007 | Caminada et al. |
| 7,322,237 B2 | 1/2008 | Kutsuna |
| 7,616,078 B2 | 11/2009 | Prandi et al. |
| 7,679,463 B2 | 3/2010 | Pernia et al. |
| 7,694,563 B2 | 4/2010 | Durante et al. |
| 7,779,687 B2 | 8/2010 | Murashima |
| 7,827,864 B2 | 11/2010 | Prandi et al. |
| 8,051,698 B2 | 11/2011 | Prandi et al. |
| 8,113,051 B2 | 2/2012 | Matsumoto et al. |
| 2007/0214883 A1 | 9/2007 | Durante et al. |
| 2008/0111585 A1 | 5/2008 | Fukuzawa |
| 2009/0114015 A1 | 5/2009 | Steinlechner |
| 2009/0260435 A1 | 10/2009 | Mayer-Wegelin et al. |
| 2010/0307243 A1 | 12/2010 | Prandi et al. |
| 2011/0146402 A1 | 6/2011 | Donadel et al. |
| 2011/0197675 A1 | 8/2011 | Caminada et al. |

FOREIGN PATENT DOCUMENTS

| | | |
|---|---|---|
| EP | 1832841 A1 | 9/2007 |
| WO | 02/065055 A2 | 8/2002 |

MICROELECTROMECHANICAL DEVICE HAVING AN OSCILLATING MASS AND METHOD FOR CONTROLLING A MICROELECTROMECHANICAL DEVICE HAVING AN OSCILLATING MASS

BACKGROUND

1. Technical Field

The present disclosure relates to a microelectromechanical device having an oscillating mass and a method for controlling a microelectromechanical device having an oscillating mass.

2. Description of the Related Art

As is known, the use of microelectromechanical systems (MEMS) has increasingly spread in various technological sectors and has yielded encouraging results especially in providing inertial sensors, micro-integrated gyroscopes, and electromechanical oscillators for a wide range of applications.

MEMS systems of this type are usually based upon microelectromechanical structures comprising at least one mass connected to a fixed body (stator) by means of springs and movable with respect to the stator according to pre-set degrees of freedom. The movable mass and the stator are capacitively coupled through a plurality of respective comb-fingered and mutually facing electrodes so as to form capacitors. The movement of the movable mass with respect to the stator, for example on account of an external stress, modifies the capacitance of the capacitors; whence it is possible to trace back to the relative displacement of the movable mass with respect to the fixed body and hence to the force applied. On the other hand, by supplying appropriate biasing voltages, it is possible to apply an electrostatic force to the movable mass to set it in motion. In addition, for providing electromechanical oscillators the frequency response of MEMS inertial structures is exploited, which is typically of a second-order low-pass type with one resonant frequency.

MEMS gyroscopes have a more complex electromechanical structure, which comprises two masses that are movable with respect to the stator and are coupled to one another so as to have a relative degree of freedom. The two movable masses are both capacitively coupled to the stator. One of the masses is dedicated to driving and is kept in oscillation at the resonant frequency. The other mass is drawn in the (translational or rotational) oscillatory motion and, in the event of rotation of the microstructure with respect to a pre-determined gyroscopic axis with an angular velocity, is subject to a Coriolis force proportional to the angular velocity itself. In practice, the driven mass, which is capacitively coupled to the fixed body through electrodes, as likewise the driving mass, operates as an accelerometer, which enables detection of the Coriolis force and acceleration and hence makes it possible to trace back to the angular velocity.

In gyroscopes, as likewise in other devices, the transduction of the quantities requires that the movable mass or the system of movable masses be maintained in oscillation at a given frequency. Clearly, upon turning-on of the device (power-on) or at exit from low-consumption configurations (power-down) a start-up transient, during which the movable mass is brought up to the given frequency, occurs before the movable mass or the system of movable masses reaches a stable condition of oscillation.

In the start-up transient, the oscillatory motion is forced through start-up components, which supply a fixed amount of energy, normally in the form of a pulse train of pre-set duration, sufficient to reach the nominal operating frequency. Once the transient is exhausted, the start-up components are de-activated, and the oscillation is maintained by the devices that maintain normal operation.

BRIEF SUMMARY

One embodiment is a microelectromechanical device having an oscillating mass is provided, and a method for controlling a microelectromechanical device having an oscillating mass, which reduce the start-up transients and the risk of collisions between the movable structure and the fixed structure.

According to one embodiment, a microelectromechanical device is provided that includes a start-up circuit configured to supply a first quantity of energy, referred to below as a forcing signal packet, to a movable mass of the device, and to determine, following the supply of the first quantity of energy, whether the movable mass is oscillating with sufficient energy to continue in stable oscillation under control of a driver circuit. This can be done by comparing an oscillating frequency of the movable mass with a reference frequency. If the oscillating frequency of the movable mass is within a selected range relative to the reference frequency, it can be determined that the movable mass is oscillating with sufficient energy to continue in stable oscillation. Under these conditions, the system is configured to switch to normal operation. If the oscillating frequency of the movable mass is not within the selected range relative to the reference frequency, the start-up circuit is configured to supply an additional quantity of energy to the movable mass, then again compare the oscillating frequency of the movable mass to the reference frequency. These steps are repeated until sufficient energy has been imparted to the movable mass that the system can continue in stable oscillation.

BRIEF DESCRIPTION OF THE SEVERAL VIEWS OF THE DRAWINGS

For a better understanding of the invention, some embodiments thereof will now be described, purely by way of non-limiting example and with reference to the attached drawings, wherein.

DETAILED DESCRIPTION

As noted in the background, it is known to use start-up components to force oscillatory motion in a MEMS gyroscope structure. Known solutions necessitate, however, rather long start-up times. The duration of the transient is determined taking into account a safety margin in order to prevent the device from failing to reach a condition of stable oscillation at the nominal frequency.

On the other hand, if the energy supplied is excessive, the amplitude of the oscillations can prove excessive and give rise to collisions of the movable mass or of the system of movable masses with the fixed structure.

Figure 1:
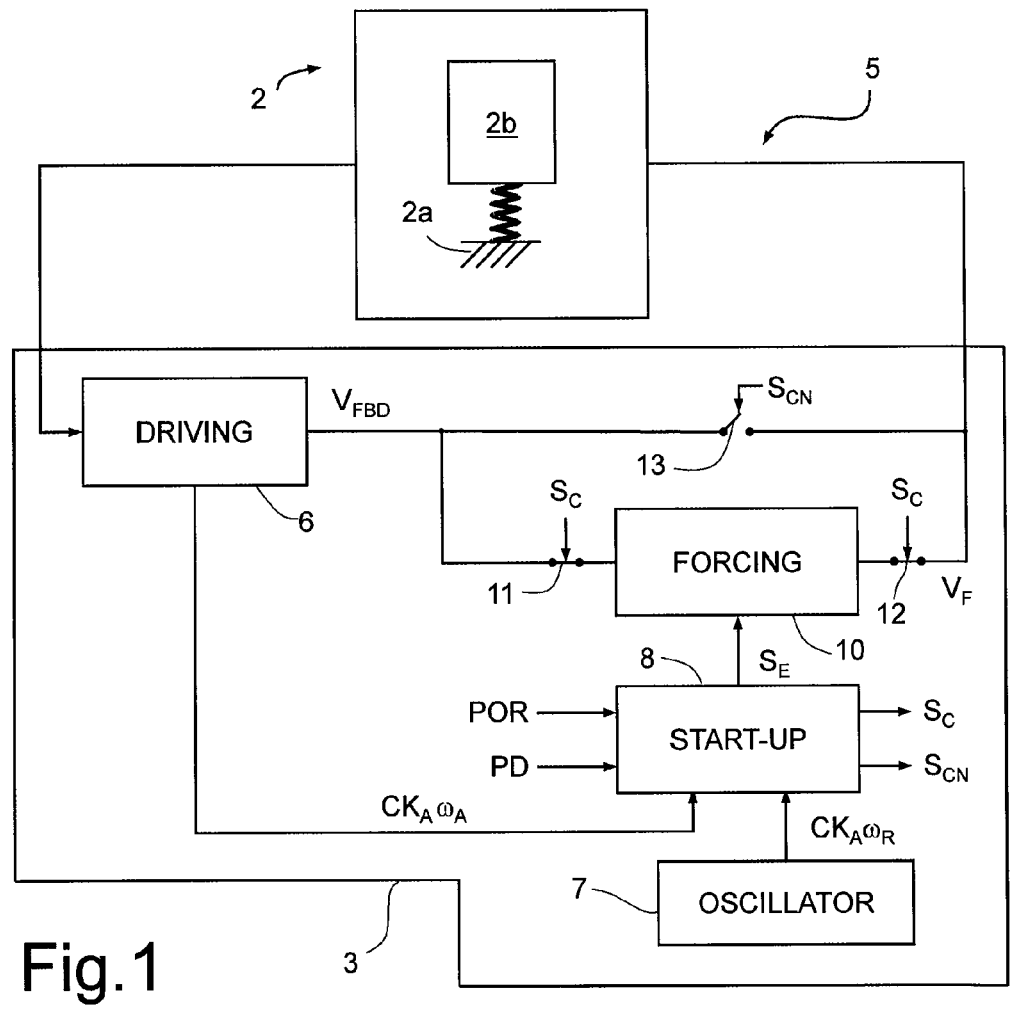
FIG. 1 is a simplified block diagram of a microelectromechanical device in accordance with a first embodiment of the present invention.

FIG. 1 schematically illustrates a generic oscillating microelectromechanical device, designated as a whole by the reference number 1. For example, the device 1 may be an electromechanical oscillator that can be used in telecommunications or else an inertial sensor with force-feedback reading.

The device 1 comprises a microstructure 2 and a driving device 3, connected to the microstructure 2 so as to form an oscillating electromechanical loop 5. In greater detail, the microstructure 2 comprises a body or stator 2a and a movable mass 2b elastically connected to the stator 2a so as to be able to oscillate about a resting position according to a degree of freedom.

The driving device 3 comprises a driving stage 6, an oscillator 7, a start-up stage 8 and a forcing stage 10.

The driving stage 6 is coupled to the movable mass 2b, for example by capacitive coupling, and is configured to detect displacements of the movable mass 2b and for supplying, in a normal operating mode, feedback driving signals $V_{FBD}$. As a result of coupling with the movable mass 2b, the feedback driving signals $V_{FBD}$ apply electrostatic forces designed to maintain the movable mass 2b itself in oscillation at a stable working frequency $\omega_D$. In addition, the driving stage 6 generates a current clock signal $CK_A$, having a current frequency $\omega_A$, which, in steady-state conditions, coincides with the working frequency $\omega_D$.

The oscillator 7 supplies a reference clock signal $CK_R$ asynchronous with respect to the oscillations of the microelectromechanical loop 5 and calibrated at a reference frequency $\omega_R$ close to the nominal working frequency of the electromechanical loop 5.

The start-up stage 8 and the forcing stage 10 are selectively activatable in specific operating conditions in which steady-state oscillation of the movable mass 2b has not yet been reached. In particular, the start-up stage 8 and the forcing stage 10 are activatable upon turning-on (power-on) of the device 1 and at exit from energy-saving configurations (exit from power-down).

The start-up stage 8 is connected to the driving device 6 for receiving the current clock signal $CK_A$ and is configured to alternatively activate and deactivate the forcing stage 10 on the basis of a comparison between the frequency of the current clock signal $CK_A$ (current frequency $\omega_A$) and the reference frequency $\omega_R$. In particular, the start-up stage 8 generates an enable signal $S_E$, which has an active (logic) value when the frequency of the current clock signal $CK_A$ falls outside of an acceptable range I with respect to the reference frequency $\omega_R$, and otherwise has an inactive (logic) value. In one embodiment, the acceptable range I is given by $I=\omega_R \pm X$ %, for example with X=10; however, the range I could also be asymmetrical with respect to the reference frequency $\omega_R$. The start-up stage 8 can in turn be activated in response to respective active values of power-on signals POR or signals of exit from power-down PD.

The forcing stage 10 is connectable between the output of the driving stage 6 and driving inputs of the microstructure 2 through start-up switches 11, 12. A bypass switch 13 enables connection of the output of the driving device 6 directly to the driving inputs of the microstructure 2, excluding the forcing stage 10. In particular, the start-up switches 11, 12 are controlled by an actuation signal $S_C$, supplied by the start-up stage 8, whereas the bypass switch 13 is controlled by the bypass actuation signal $S_{CN}$.

The forcing stage 10 is controlled by the start-up stage 8 through the enable signal $S_E$ and is configured to apply forcing signal packets $V_F$, in this case voltages, to the movable mass 2b (in other embodiments, the forcing signals can be charge packets or currents). Here and in what follows, by "forcing signal packets" is generally meant sinusoidal signals or sequences of pulses that can be applied to the movable mass 2b for producing a force thereon and have the frequency of the oscillator 7 and a controlled duration. The duration of each forcing signal packet $V_F$ (in practice, the duration of the sinusoidal signal or the number of pulses) and their amplitude determines the total energy transferred to the movable mass 2b. The forcing signal packets $V_F$ are defined in such a way that the energy transferred to the movable mass 2b by each packet is less than the energy that sends the movable mass into stable oscillation at the working frequency $\omega_D$ starting from a condition of rest.

Figure 2:
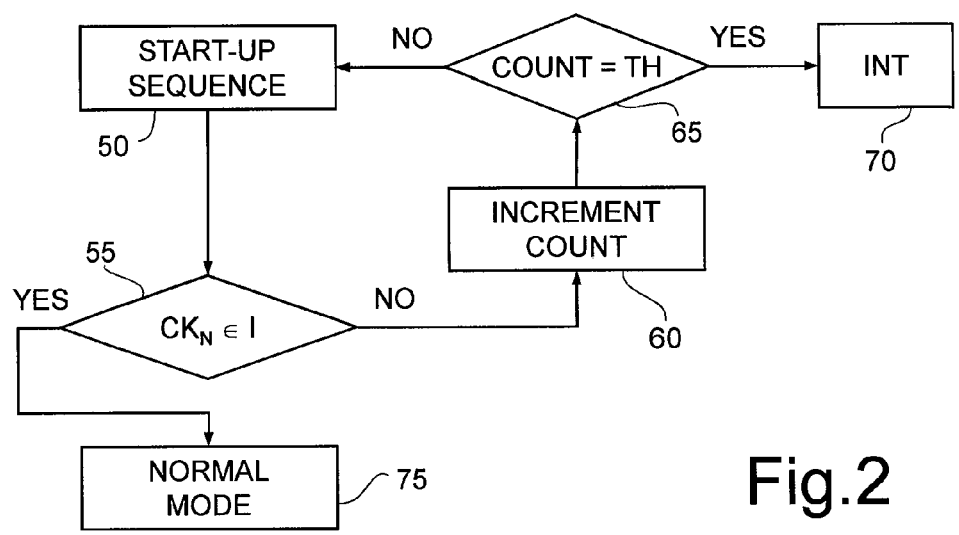
FIG. 2 is a flowchart regarding a method implemented by the device of FIG. 1, according to one embodiment of the present invention.

When the device 1 is turned on or when the normal operating mode is restored, the movable mass 2b is at rest or in motion with reduced oscillation amplitude. The latter eventuality may for example arise in the event of an exit from an energy-saving mode after a short stay, so that the transient of arrest of the movable mass 2b is not yet exhausted. Either the power-on signal POR or the exit from power-down signal PD is set, in a known way, to the active state, and the start-up device 8 is enabled and executes the procedure described hereinafter with reference to FIG. 2.

Initially, the start-up stage 8 activates the forcing stage 10 by setting the enable signal $S_E$ and the actuation signal $S_C$ to the active value, and the bypass signal $S_{CN}$ to an inactive value. In response to activation, the forcing stage 10 supplies a forcing signal packet $V_F$ to the movable mass 2b, which increases the oscillation amplitude (block 50).

When the forcing signal packet $V_F$ is supplied, the start-up stage 8 surveys the current frequency $\omega_A$ of the current clock signal $CK_A$, which indicates the oscillation frequency of the microelectromechanical loop 5, and compares it with the acceptable range I (block 55).

If the current frequency $\omega_A$ of the current clock signal $CK_A$ falls outside the acceptable range I (output NO from block 55), a previously reset counter COUNT is incremented (block 60). In practice, then, the start-up stage 8 determines whether to proceed with or stop the application of forcing signal packets $V_F$ on the basis of the comparison between the current frequency $\omega_A$ and the reference frequency $\omega_R$.

If the counter COUNT has reached a programmed threshold value TH (output YES from block 65), the start-up stage 8 generates an interrupt signal INT, and the start-up procedure is arrested (block 70). If, instead, the threshold TH has not yet been reached, the forcing stage 10, kept active by the start-up stage 8, supplies a new forcing signal packet $V_F$ to the movable mass 2b, which accelerates (block 50).

When the current frequency $\omega_A$ of the current clock signal $CK_A$ falls within the acceptable range I (output YES from block 55), the start-up stage 8 terminates the start-up procedure (block 75). In this way, the duration of the start-up step is adapted to the specific characteristics of the device 1 and the current operating conditions. Consequently, on the one hand, the time for turning-on and for restoring the normal operating mode is shortened. The series of forcing signal packets $V_F$ can in fact be arrested as soon as the oscillation frequency of the current clock signal $CK_A$ is sufficiently close to the reference frequency $\omega_R$ that the driving stage 6 is in a condition to maintain the oscillation autonomously. The advantage is particularly evident at exit from low-consumption conditions, when the movable mass 2b has not yet stopped and presents residual oscillations. In this case, to restore the conditions of normal oscillation it is sufficient to transfer less energy to the movable mass 2.

Furthermore, the risk of collisions between the movable mass 2b and the stator 2a is reduced or eliminated, because the transfer of energy to the movable mass 2b is timely arrested when the state of nominal oscillation is reached. In this way, oscillations of critical amplitude are prevented.

Figure 3:
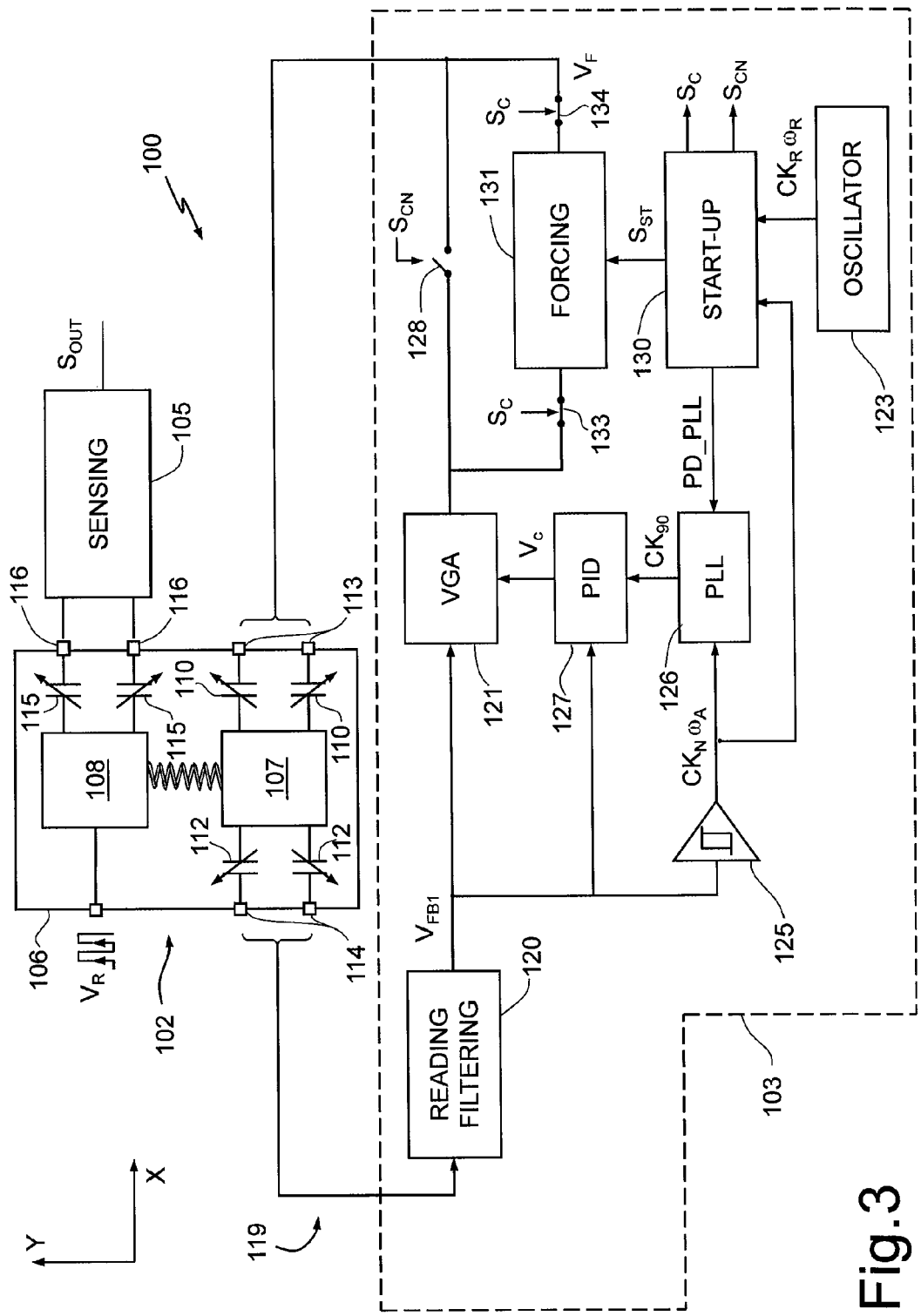
FIG. 3 is a simplified block diagram of a microelectromechanical gyroscope in accordance with a further embodiment of the present invention.

FIG. 3 shows an embodiment in which a microelectromechanical gyroscope 100 comprises a microstructure 102, made of semiconductor material, a driving device 103, and a sensing device 105.

The microstructure 102 is made of semiconductor material and comprises a fixed structure 106 and a system of movable masses, including a driving mass 107, and at least one sensing mass 108. For reasons of simplicity, in the embodiment illustrated here reference will be made to the case of a uniaxial gyroscope, in which just one sensing mass 108 is present. The ensuing description applies, however, also in the case of multiaxial gyroscopes, which comprise two or more sensing masses for detecting rotations according to respective independent axes.

The driving mass 107 is elastically connected through suspensions (not shown) to the fixed structure 106 so as to be able to oscillate about a resting position according to a translational or rotational degree of freedom.

The sensing mass 108 is mechanically coupled to the driving mass 107 so as to be driven in motion according to the degree of freedom of the driving mass 107 itself. In addition, the sensing mass 108 is elastically connected to the driving mass 107 so as to oscillate in turn with respect to the driving mass 107 itself, with a respective further translational or rotational degree of freedom. In particular, in the embodiment described herein, the driving mass 107 is linearly movable along a driving axis X, whilst the sensing mass 108 is movable with respect to the driving mass 107 according to a sensing axis Y perpendicular to the driving axis X. It is understood, however, that the type of movement (translational or rotational) allowed by the degrees of freedom and the arrangement of the driving and sensing axes can vary according to the type of gyroscope, but that the principles disclosed herein are equally applicable to devices operating with either type of movement. Accordingly, with reference to the movements of the driving mass 107 and of the sensing mass 108, either of the expressions "according to an axis" and "in accordance with an axis" can be understood as indicating movements along an axis or about an axis, according to whether the movements allowed to the masses by the respective degrees of freedom of a particular device are translational or else rotational, respectively. In a similar way, either of the expressions "according to a degree of freedom" and "in accordance with a degree of freedom" can be understood as indicating either translational or rotational movements, as allowed by the degree of freedom itself.

In addition, the driving mass 107 (with the sensing mass 108) is connected to the fixed structure 106 so as to define a resonant mechanical system with one resonant frequency (according to the driving axis X).

As illustrated schematically in FIG. 3, the driving mass 107 is capacitively coupled to the fixed structure 106 by capacitive driving units 110 and capacitive feedback sensing units 112. The capacitive coupling is of a differential type and is determined by the relative position of the driving mass 107 with respect to the fixed structure 106. In particular, the capacitive driving units 110 and the capacitive feedback sensing units 112 are accessible from outside the microstructure 102 through driving terminals 113 and feedback sensing terminals 114, respectively.

The sensing mass 108 is capacitively coupled to the fixed structure 106 by capacitive signal sensing units 115, accessible from outside by signal sensing terminals 116. Also in this case, the capacitive coupling is of a differential type and is determined by the relative position of the sensing mass 108 with respect to the fixed structure 106.

By way of example, the microstructure 102 can be obtained as described in the European patent EP-A-1 253 399 for a uniaxial gyroscope. The microstructure of a multiaxial gyroscope could be obtained, for example, as described in detail in the European published patent application No. EP-A-100 832 841 and in the corresponding U.S. published patent application No. US 2007/0214883 A1.

The driving device 103 is connected to the driving terminals 113 and to the feedback sensing terminals 114 of the microstructure 102 so as to form, with the driving mass 107, a microelectromechanical loop 119. The driving device 103 is configured so as to maintain the microelectromechanical loop 119 in oscillation at a driving frequency $\omega_D$ close to the resonant frequency of the mechanical system defined by the driving mass 107 (with the sensing mass 108) connected to the fixed structure 106.

The sensing device 105 is connected to the sensing terminals 116 and converts signals indicating the displacement of the sensing mass 108 into an output signal $S_{OUT}$ indicating the speed of rotation of the microstructure 102.

In greater detail, the driving device 103 comprises a reading and filtering stage 120, a variable-gain amplifier 121, an oscillator 123, a comparator 125, a phase-locked-loop (PLL) circuit 126, a controller 127, a start-up stage 130, and a forcing stage 131.

The reading and filtering stage 120 is connected to the feedback sensing terminals 114 of the microstructure 102 and supplies a first feedback signal $V_{FB1}$, indicating the conditions of oscillation of the driving mass 107. In particular, the first feedback signal $V_{FB1}$ indicates the velocity of the driving mass 107. In a different embodiment, the first feedback signal $V_{FB1}$ indicates the position of the driving mass 107. In addition, the reading and filtering stage 120 controls the phase of the first feedback signal $V_{FB1}$ so as to guarantee the condition of oscillation on the phase for the microelectromechanical loop 119.

The variable-gain amplifier 121 is coupled to the reading and filtering stage 120 for receiving the first feedback signal $V_{FB1}$ and is selectively connectable to the feedback sensing terminals 114 of the microstructure 102 through bypass switches 128 (in effect, two connection lines and a bypass switch 128 for each of the connection lines are present between the variable-gain amplifier 121 and the feedback sensing terminals 114; for reasons of simplicity, FIG. 3 represents a multiple line with just one switch).

The oscillator 123 is connected to the start-up stage 130 for supplying a reference clock signal $CK_R$, which is constant and independent of the oscillation frequency of the driving mass 107. In particular, the reference clock signal $CK_R$ has a frequency calibrated at a reference frequency $\omega_R$.

The comparator 125 is coupled to the reading and filtering stage 120 for receiving the first feedback signal $V_{FB1}$ and is configured to detect the instants of zero crossing of the input. In practice, the output of the comparator 125, which is connected to the PLL circuit 126 and to the start-up stage 130, supplies a natural clock signal $CK_N$, which, in steady state conditions, is synchronous (in frequency and phase) with the oscillations of the driving mass 107.

The PLL circuit 126 receives the natural clock signal $CK_N$ from the comparator 125. An output of the PLL circuit 126 is connected to a clock input 127a of the controller 127 and supplies a clock signal $CK_{90}$, phase-shifted by 90° with respect to the natural clock signal $CK_N$. In practice, the clock signal $CK_{90}$ switches in the presence of the peaks of the first feedback signal $V_{FB1}$.

The controller 127, for example a PI or PID controller, receives the first feedback signal $V_{FB1}$ and the clock signal $CK_{90}$ and controls the gain of the variable-gain amplifier 121 through a control signal $V_C$ so as to maintain the amplitude of oscillation in the microelectromechanical loop 119.

The start-up stage 130 is selectively activatable in response to active values alternatively of a power-on signal POR or of an exit from power-down signal PD. When activated, the start-up stage 130 disables the PLL circuit through a selective enable signal PD_PLL and controls the forcing stage 131 through a start-up signal $S_{ST}$, as described hereinafter.

The forcing stage 131 is connectable between the output of the variable-gain amplifier 121 and the driving terminals 113 of the microstructure 102 through start-up switches 133, 134, controlled through an actuation signal $S_C$, supplied by the start-up stage 130. The bypass switch 128 (controlled by the bypass actuation signal $S_{CN}$) enables connection of the output of the variable-gain amplifier 121 directly to the driving terminals 113, excluding the forcing stage 131. In particular, the start-up switches 133, 134 are controlled by a control signal $S_C$, whereas the bypass switch 128 is controlled by the bypass actuation signal $S_{CN}$, also generated by the start-up stage 130.

The forcing stage 131 is controlled by the start-up stage 130 through the start-up signal $S_{ST}$. In particular, the forcing stage 131 is configured to apply to the driving mass 107 forcing signal packets $V_F$ of a controlled and programmed duration at the frequency of the reference clock signal $CK_R$, in response to the start-up signal $S_{ST}$. The duration of each forcing signal packet $V_F$ (in practice the duration of the sinusoidal signal or the number of pulses) and the signal amplitude determine the total energy transferred to the driving mass 107. The forcing signal packets $V_F$ are defined in such a way that the energy transferred to the driving mass 107 by each packet is less than the energy necessary to send the movable mass into stable oscillation at the driving frequency $\omega_D$ starting from a condition of rest. In one embodiment, in particular, the forcing signal packets $V_F$ have a first programmable duration $T_1$ (FIG. 7), when the start-up stage 130 and the forcing stage 131 are activated in response to an active value of the start-up signal POR; and a second duration $T_2$, programmable and shorter than the first duration $T_1$, when the start-up stage 130 and the forcing stage 131 are activated in response to an active value of the exit from power-down signal PD. For example, the first duration $T_1$ is 10 ms, and the second duration $T_2$ is 2 ms. The gyroscope 100 basically operates as already described for the device 1 of FIG. 1.

In a normal operating mode, the reading and filtering stage 120 and the variable-gain amplifier 121 co-operate for maintaining the microelectromechanical loop 119 in oscillation at the driving frequency $\omega_D$, while the forcing stage 131 is excluded and inactive.

In the case of rotation about a gyroscopic axis, the sensing mass 108 is subjected to a Coriolis acceleration proportional to the angular rate, which is transduced into the output signal $S_{OUT}$ by the sensing device 105.

At start-up of the gyroscope 100 or at exit from power-down conditions, the start-up stage 130 and the forcing stage 131 are activated. At the same time, the start-up switches 133, 134 and the bypass switch 128 switch, and the PLL circuit 126 is disabled by the start-up stage 130.

The start-up stage 130, through the start-up signal $S_{ST}$, requests the forcing stage to send a forcing signal packet $V_F$ to the driving mass 107, which starts to oscillate with an increasing frequency. New forcing signal packets $V_F$ are repeatedly sent until the frequency of the natural clock signal $CK_N$, which is indicative of the amplitude of oscillation of the driving mass 107, falls stably within an acceptable range I with respect to the reference frequency $\omega_R$, for example I=$\omega_R$±X %. In one embodiment, the condition is considered verified if: the current frequency $\omega_A$ of the natural clock signal $CK_N$ remains within the acceptable range I for a third duration $T_3$ when the activation of the start-up stage 130 and of the forcing stage 131 is determined by the active value of the start-up signal POR; and the current frequency $\omega_A$ of the natural clock signal $CK_N$ remains within the acceptable range I for a fourth duration $T_4$, shorter than the third duration $T_3$, when the activation of the start-up stage 130 and of the forcing stage 131 is determined by the active value of the exit from power-down signal PD.

When the condition is verified, the start-up stage 130 activates the PLL circuit 126 through the selective enable signal PD_PLL. After a transient, the PLL circuit 126 locks to the oscillation of the driving mass 107. At this point, the normal operating mode is restored, and the start-up stage 130 and the forcing stage 131 are de-activated.

In practice, the start-up stage decides whether to apply further forcing signal packets $V_F$ to the driving mass 107 on the basis of the comparison between the current frequency $\omega_A$ of the natural clock signal $CK_N$ and the reference frequency $\omega_R$. If the two frequencies are sufficiently close and hence the PLL circuit 126 is in a condition to rapidly lock onto the oscillations of the microelectromechanical loop 119, the sequence of forcing signal packets $V_F$ is interrupted; otherwise, the sequence proceeds.

Advantageously, in this case, the locking transient of the PLL circuit 126 is drastically reduced, in addition to having obtained a reduction in the overall time for setting the driving mass 107 in oscillation and to having prevented risks of collision of the movable parts of the microstructure 102 with the fixed structure 106.

Figure 4:
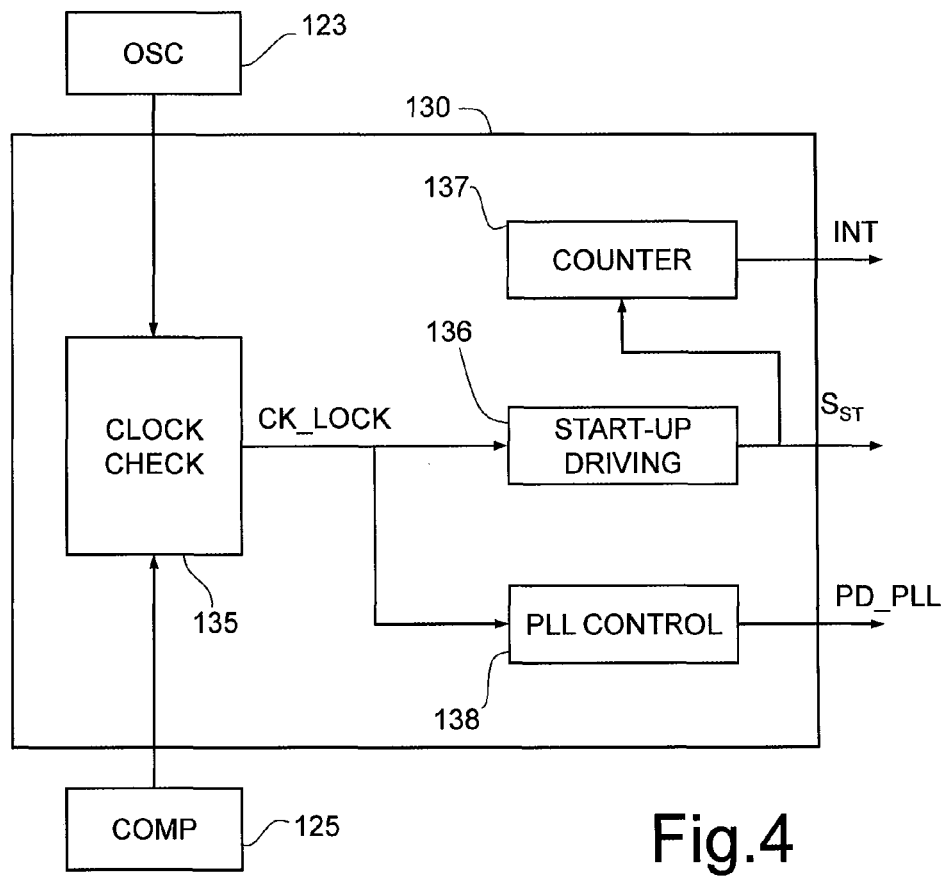
FIG. 4 is a more detailed block diagram of a stage of the gyroscope of FIG. 3.

FIG. 4 illustrates in greater detail the start-up stage 130, which comprises a clock-verification module 135, a start-up-driving module 136, an interrupt counter 137, and a PLL control module 138.

The clock-verification module 135 is connected to the comparator 125 and to the oscillator 123 for receiving, respectively, the natural clock signal $CK_N$ and the reference clock signal $CK_R$ and is structured to verify that the natural clock signal $CK_N$ stays within the acceptable range I. The clock-verification module 135 supplies a clock-lock signal CK_LOCK, which has a locking (logic) value when the natural clock signal $CK_N$ falls within the acceptable range I, and an asynchronous-frequency (logic) value otherwise.

The start-up-driving module 136 and the PLL control module 138 are coupled to the clock-verification module 135 for receiving the clock-lock signal CK_LOCK.

The start-up-driving module 136 supplies the start-up signal $S_{ST}$ and assigns thereto the active value when the clock-lock signal CK_LOCK has the lock value. In addition, at the end of each forcing signal packet $V_F$ supplied by the forcing stage 131 during one and the same transient of start-up of the gyroscope 100, the start-up-driving module 136 increments the interrupt counter 137.

If a count threshold TH is reached, the interrupt counter 137 generates an interrupt signal INT that is made available outside the gyroscope 100 through an interrupt terminal 100a. In one embodiment, the interrupt signal INT is generated through a logic network (not illustrated herein) associated with the interrupt counter 137.

The PLL control module 138 imposes the value of the selective enable signal PD_PLL. In particular, when the clock-lock signal CK_LOCK has the asynchronous-frequency value (i.e., when the natural clock signal $CK_N$ falls outside the acceptable range I), the selective enable signal PD_PLL is set to a disabling (logic) value, which sends the PLL circuit 126 into the inactive (power-down) condition.

When the clock-lock signal CK_LOCK maintains the lock value for a fifth duration $T_5$ (in the case of turning-on of the gyroscope 100) or a sixth duration T6 (shorter than the fifth duration $T_5$, in the case of exit from the condition of power-down of the gyroscope 100), the selective enable signal PD_PLL is set to an enable (logic) value, in the presence of which the PLL circuit 126 is enabled and operates normally.

Figure 5:
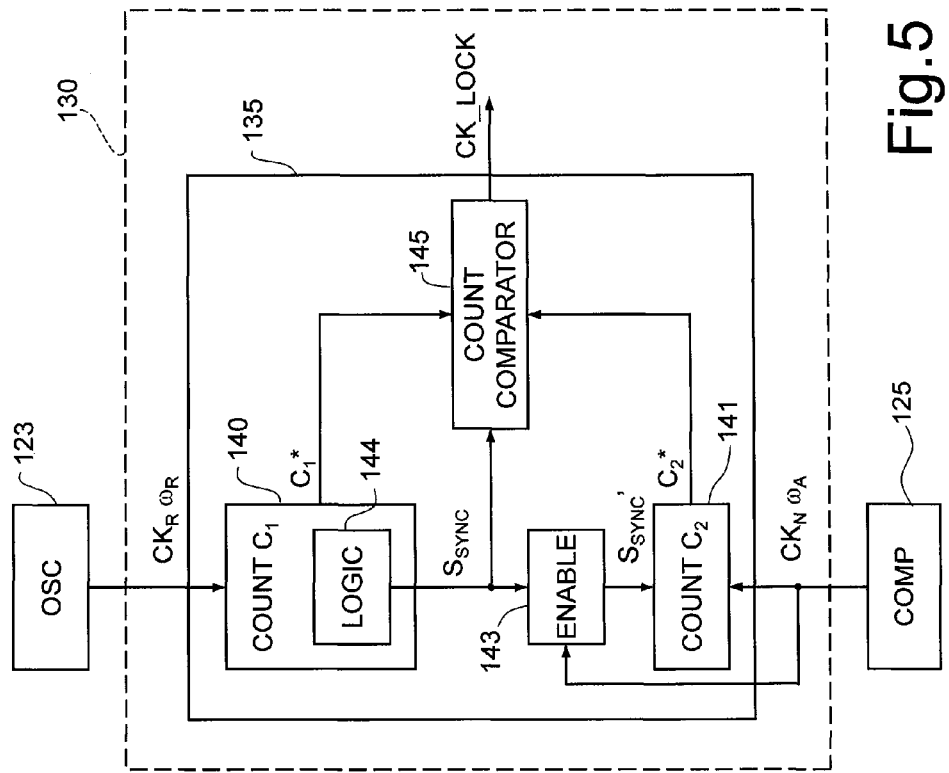
FIG. 5 is a more detailed block diagram of a stage of a first element of the stage of FIG. 4.

FIG. 5 shows in greater detail the clock-verification module 135, which comprises a first clock counter 140, a second clock counter 141, an enable element 143, and a counting comparator 145.

The first clock counter 140 has a count input coupled to the oscillator 123 for receiving the reference clock signal $CK_R$ and stores a first counting value $C_1$. In addition, the first clock counter 140 is provided with a synchronization logic network 144, which generates a synchronization signal $S_{SYNC}$. The synchronization signal $S_{SYNC}$ is supplied to the enable element 143 and to the counting comparator 145 and has an enable value when the first counting value $C_1$ stored in the first clock counter 140 is less than a control value $C_1^*$. When the control value $C_1^*$ is reached, the synchronization signal $S_{SYNC}$ switches to a disabling value and, moreover, the first clock counter 140 is reset.

The second clock counter 141 has a count input coupled to the comparator 125, for receiving the natural clock signal $CK_N$, and an enable output connected to the enable element 143. The second clock counter 141 stores a second counting value C2, which is incremented at each cycle of the natural clock signal $CK_N$ when the second clock counter 141 is enabled.

The enable element 143 is, for example, a flip-flop of a DT type and receives the synchronization signal $S_{SYNC}$ on a data input from the first clock counter 140 and the natural clock signal $CK_N$ on a timing input from the comparator 125. In this way, the enable element 143 transfers the value of the synchronization signal $S_{SYNC}$ to the enable output of the second clock counter 141, which is thus incremented at each cycle of the natural clock signal $CK_N$, as long as the synchronization signal $S_{SYNC}$ remains at the enable value (i.e., until the first clock counter 140 reaches the control value $C_1^*$). The natural timing signal $CK_N$ on the timing input of the enable element 143 prevents any spurious switching and errors of the second clock counter 141.

The counting comparator 145 is coupled to the first clock counter 140, from which it also receives the synchronization signal $S_{SYNC}$, and to the second clock counter 141. The counting comparator 145 supplies at output the clock-lock signal CK_LOCK and determines the value thereof, as described hereinafter.

Figure 6:
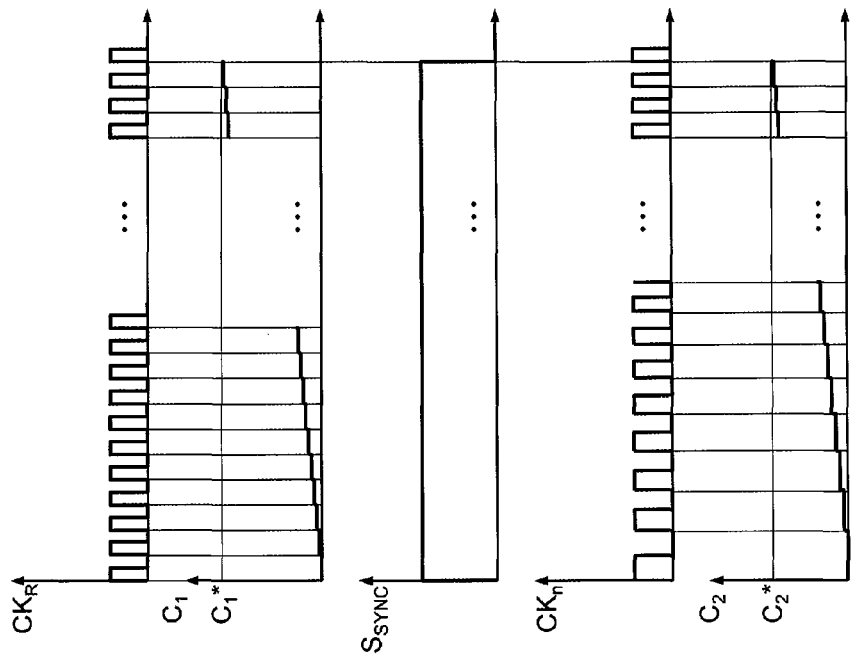
FIG. 6 shows graphs regarding quantities used in the gyroscope of FIG. 3.

When the first clock counter 140 starts a count after being reset, the synchronization signal $S_{SYNC}$ switches to the enable value (FIG. 6). The second clock counter 141 is enabled and is incremented at each cycle of the natural clock signal $CK_N$, independently of the first clock counter 140. In addition, the current frequency $\omega_A$ of the natural clock signal $CK_N$ tends to reach the driving frequency $\omega_D$ as a result of the forcing signal packets $V_F$ supplied by the forcing stage 131. Initially, in fact, the oscillations of the driving mass 107 and of the microelectromechanical loop 119 have very small or in any case reduced amplitude. Hence, due to the presence of noise, zero-crossings of the first feedback signal $V_{FB1}$, which are detected by the comparator 125 to determine the actual frequency $\omega_A$, are substantially random and are only approximately correlated with oscillation of the driving mass 107. As the oscillation amplitude increases, the influence of noise is less and less important, until the actual frequency $\omega_A$ of the natural clock signal $CK_N$ practically coincides with the working frequency of the microelectromechanical loop 119. The variation in frequency of the natural clock signal $CK_N$ is illustrated in an exaggerated way in FIG. 6.

When the first clock counter 140 reaches the control value $C_1^*$, the synchronization signal $S_{SYNC}$ switches to the disabling value, and the final counting value $C_2^*$ stored in the second clock counter 141 is frozen.

In addition, the counting comparator 145 fetches the control value $C_1^*$ and the final counting value $C_2^*$ from the first clock counter 140 and from the second clock counter 141, respectively, and assigns a value to the clock-lock signal CK_LOCK according to whether the following lock condition is verified or not:

$$\left| \frac{C_1^* - C_2^*}{C_1^*} \right| \leq X$$

More precisely, if the control value $C_1^*$ and the final counting value $C_2^*$ satisfy the lock condition, the lock value is assigned to the clock-lock signal CK_LOCK. In this case, in fact, the current frequency $\omega_A$ of the natural clock signal $CK_N$ is close to the reference frequency $\omega_R$ of the asynchronous clock signal $CK_R$ and hence to the driving frequency $\omega_D$. In particular, the current frequency $\omega_A$ of the natural clock signal $CK_N$ enables the PLL circuit 126 to perform phase lock rapidly, and hence the microelectromechanical loop 119 is soon in a condition to self-support the oscillation.

Otherwise, i.e., if the inequality is not verified, the counting comparator 145 assigns the asynchronous-frequency value to the clock-lock signal CK_LOCK.

Figure 7:
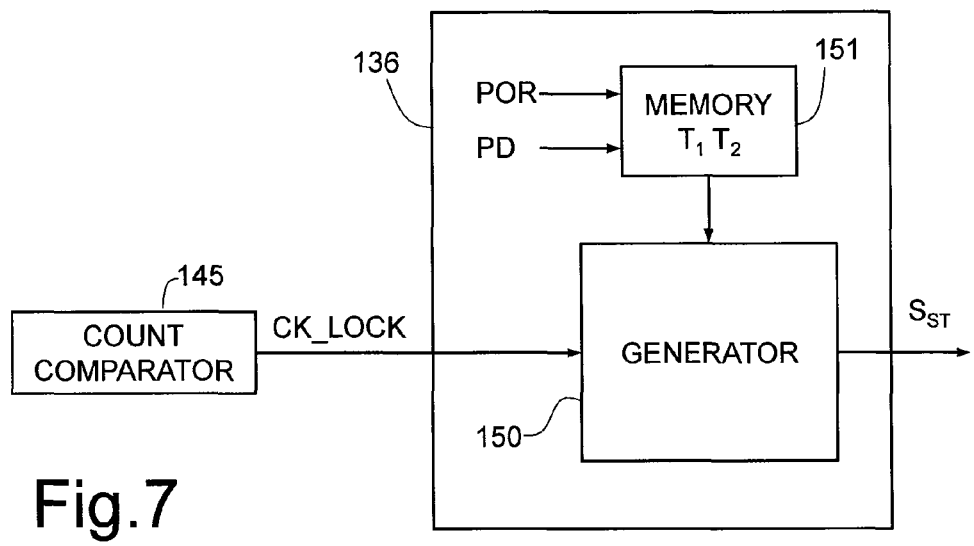
FIG. 7 is a more detailed block diagram of a stage of a second element of the stage of FIG. 4.

Illustrated in FIG. 7 is the start-up-driving module 136, which comprises a generator block 150 and a memory element 151, stored in which are the first duration $T_1$ (duration of a single forcing signal packet $V_F$ during turning-on) and the second duration $T_2$ (duration of a single forcing signal packet $V_F$ during exit from power-down). As already mentioned, the duration of a single forcing signal packet $V_F$ at exit from power-down (second duration $T_2$) is shorter than the duration of a single forcing signal packet $V_F$ at start-up (first duration $T_1$).

The generator block 150 is coupled to the counting comparator 145 of the clock-verification module 130 for receiving the clock-lock signal CK_LOCK and, selectively in the presence of the asynchronous-frequency value of the clock-lock signal CK_LOCK, supplies the start-up signal $S_{ST}$ for the forcing stage 131. The value of duration of the forcing signal packets $V_F$ is supplied by the memory element 151 on the basis of the values of the start-up signal POR and of the exit from power-down signal PD.

According to one embodiment, the first duration $T_1$ is selected so that the energy transferred is only slightly less than the energy that would send the movable mass into stable oscillation at the working frequency $\omega_D$ starting from a rest condition. When the system is initially started from an off condition, the start-up stage 130 and the forcing stage 131 are initially activated in response to the start-up signal POR. Consequently, a forcing signal packet $V_F$ having the first duration $T_1$ is applied to the driving mass 107. Thereafter, until the driving mass reaches stable operation, the start-up stage 130 and the forcing stage 131 are activated in response to the exit from power-down signal PD, in response to which forcing signal packets $V_F$ having the second duration $T_2$ are applied to the driving mass 107. In this way, the driving mass is nearly fully energized by a first forcing signal packet of the first duration $T_1$, then quickly brought to a stable oscillating condition by subsequent application of additional forcing signal packets $V_F$ having the second duration $T_2$.

Figure 8:
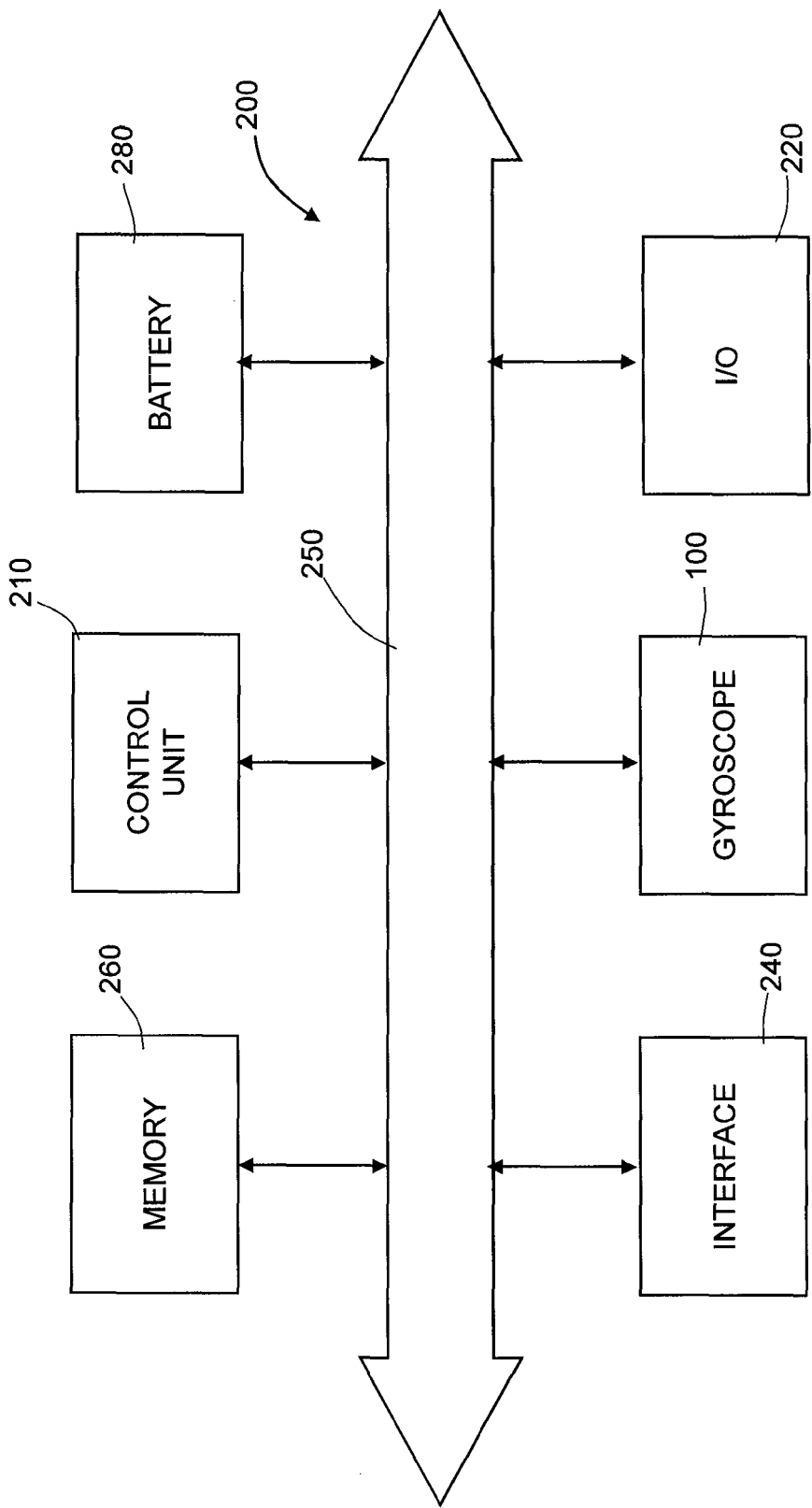
FIG. 8 is a simplified block diagram of an electronic system incorporating a microelectronic device according to one embodiment of the present invention.

Illustrated in FIG. 8 is a portion of an electronic system 200 in accordance with one embodiment. The system 200 incorporates a microelectromechanical device (in the example illustrated, the gyroscope 100) and may be used in devices as, for example, a palm-top computer (personal digital assistant, PDA), a laptop or portable computer, possibly with wireless capacity, a cell phone, a messaging device, a digital music player, a digital camera or other devices designed to process, store, transmit, or receive information. For example, the gyroscope 1 may be used in a digital camera for detecting movements and performing an image stabilization. In other embodiments, the gyroscope 1 is included in a portable computer, a PDA, or a cell phone for detecting a free-fall condition and activating a safety configuration. In a further embodiment, the gyroscope 1 is included in a motion-activated user interface for computers or video-game consoles. In a further embodiment, the gyroscope 1 is incorporated in a satellite-navigation device and is used for simultaneous position tracking in the event of loss of the satellite-positioning signal.

The electronic system 200 can comprise a controller 210, an input/output (I/O) device 220 (for example a keyboard or a display), the gyroscope 1, a wireless interface 240, and a memory 260, of a volatile or nonvolatile type, coupled to one another through a bus 250. In one embodiment, a battery 280 is used for supplying the system 200. It is to be noted that the scope of the present invention is not limited to embodiments having necessarily one or all of the devices listed.

The controller 210 can comprise, for example, one or more microprocessors, microcontrollers, and the like.

The I/O device 220 may be used for generating a message. The system 200 can use the wireless interface 240 for transmitting and receiving messages to and from a wireless communications network with a radiofrequency (RF) signal. Examples of wireless interface can comprise an antenna, and a wireless transceiver, such as a dipole antenna, even though the scope of the present invention is not limited from this standpoint. In addition, the I/O device 220 can supply a voltage representing what is stored either in the form of a digital output (if digital information has been stored) or in the form of analog information (if analog information has been stored).

Finally, it is evident that modifications and variations may be made to the method and to the device described herein, without thereby departing from the scope of the present invention, as defined in the annexed claims. For example, the various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system comprising:
   a substrate;
   a first mass elastically coupled to the substrate;
   a second mass elastically coupled to the first mass;
   a driving device coupled to the first mass, the driving device configured to move the first mass with a driving movement in a first operating mode and a second operating mode, the driving device including:
      a start-up device configured to be active during the second operating mode;
      an oscillator configured to provide a reference clock signal to the start-up device, the start-up device configured to continuously compare a current oscillation frequency of the first mass and a frequency of the reference clock signal; and
      a forcing device coupled to the start-up device, the forcing device being configured to be active during the second operating mode and configured to be inactive during the first operating mode, the start-up device configured to activate the forcing device during the second operating mode based on the comparison between the current oscillation frequency and the frequency of the reference clock signal, the forcing device being configured to transfer energy packets to the first mass during the second operating mode.

2. The system of claim 1 wherein the second mass is configured to detect a rotation of the system.

3. The system of claim 1 wherein the first operating mode is a normal operating mode and the second operating mode is a power-up operating mode.

4. The system of claim 3 wherein the normal operating mode corresponds to the first mass being in a steady oscillation state and the power-up operating mode corresponds to a temporary oscillation state prior to the steady oscillation state.

5. The system of claim 1 wherein the forcing device is configured to generate sinusoidal signals and apply the sinusoidal signals to the first mass during the second operating mode.

6. The system of claim 1 wherein the energy packets from the forcing device are less than an amount of energy that moves the first mass with a stable oscillation.

7. A device, comprising:
   a substrate;
   a mass assembly coupled to the substrate, the mass assembly including a first mass, a first terminal coupled to the first mass, and a second terminal coupled to the first mass;
   a driving assembly coupled to the first terminal and the second terminal, the driving assembly configured to drive the first mass with a driving movement, the driving assembly including:
      a comparator;
      a start-up circuit coupled to the comparator, the comparator being configured to provide a clock signal to the start-up circuit, the clock signal being synchronous in frequency and phase with an oscillation of the first mass in a first steady-state operating mode, the start-up circuit being configured to be active during a second operating mode and configured to continuously compare a current frequency of the clock signal and a reference frequency; and
      a forcing circuit coupled to the start-up circuit and to the first terminal of the mass assembly.

8. The device of claim 7 wherein the driving assembly includes a filtering circuit coupled to the second terminal of the mass assembly, the forcing circuit configured to be active during the second operating mode and configured to be inactive during the first steady-state operating mode, the start-up circuit configured to activate the forcing circuit during the second operating mode based on the comparison between the current frequency of the clock signal and the reference frequency, the forcing device being configured to transfer energy packets to the first mass during the second operating mode.

9. The device of claim 7 wherein the driving assembly includes a filtering circuit coupled to the second terminal of the mass assembly, the filtering circuit configured to output a first feedback signal to the comparator, the first feedback signal being indicative of an oscillation of the first mass.

10. The device of claim 9 wherein the clock signal is based on the first feedback signal.

11. The device of claim 7 wherein the forcing circuit is configured to provide a start-up signal to the first mass during the second operating mode, the second operating mode being a start-up mode of operation.

12. The device of claim 11 wherein the driving assembly includes switches that are configured to bypass the forcing circuit during the first steady-state operating mode and configured to couple the forcing circuit to the first mass during the second operating mode.

13. The device of claim 12 wherein the start-up circuit is configured to compare a current frequency of the clock signal with a reference frequency to determine if the device is in a normal mode of operation.

14. The device of claim 13 wherein the start-up circuit is configured to generate an activation signal and apply the activation signal to the forcing circuit when the device is in the second operating mode.

15. The device of claim 7 wherein the mass assembly includes a second mass elastically coupled to the first mass, the second mass being configured to detect a rotation of the device.

16. A method, comprising:
coupling a first terminal of a mass assembly to a first mass;
coupling a second terminal of the mass assembly to the first mass;
coupling a driving assembly to the first terminal and the second terminal, the driving assembly configured to move the first mass with an oscillation frequency;
coupling a start-up circuit of the driving assembly to a comparator of the driving assembly, the comparator providing a clock signal to the start-up circuit, the clock signal being synchronous in frequency and phase with the oscillation of the first mass in a first steady-state operating mode, the start-up circuit being configured to be active during a second operating mode and configured to continuously compare a current frequency of the clock signal and a reference frequency; and
coupling a forcing circuit of the driving assembly to the start-up circuit and to the first terminal of the mass assembly.

17. The method of claim 16, further comprising elastically coupling the first mass to a substrate and elastically coupling a second mass to the first mass.

18. The method of claim 16, further comprising coupling a filtering circuit of the driving assembly to the comparator and to the second terminal of the mass assembly.

19. A device, comprising:
a mass assembly including a first mass;
a driving assembly coupled to the first mass, the driving assembly being configured to drive the first mass with a driving movement, the driving assembly including:
a forcing circuit configured to transfer energy packets to the first mass during a power-up operating mode; and
a start-up circuit configured to activate and deactivate the forcing circuit, the start-up circuit including:
a comparator that outputs a first signal when an oscillation frequency of the first mass is between a first threshold and a second threshold and outputs a second signal when the oscillation frequency of the first mass is outside of the first and second threshold, the first signal configured to deactivate the forcing circuit;
a counter that increments in response to the second signal from the comparator and outputs a third signal when the counter exceeds a third threshold; and
an interrupt generator that generates an interrupt signal in response to the third signal.

20. The device of claim 19 wherein the driving assembly includes an oscillator coupled to the start-up circuit, the oscillator configured to provide a reference clock signal to the start-up circuit, the first and second threshold being based on the reference clock signal.

21. The device of claim 19 wherein the driving assembly includes a comparator, the comparator configured to provide a clock signal to the start-up circuit, the clock signal being synchronous in frequency and phase with the oscillation of the first mass in a steady-state mode of operation.

* * * * *